United States Patent
Murakami et al.

[11] Patent Number: 6,140,147
[45] Date of Patent: Oct. 31, 2000

[54] METHOD FOR DRIVING SOLID-STATE IMAGING DEVICE

[75] Inventors: Ichiro Murakami; Yasutaka Nakashiba, both of Tokyo, Japan

[73] Assignee: NEC Corporation, Tokyo, Japan

[21] Appl. No.: 09/361,976

[22] Filed: Jul. 28, 1999

[30] Foreign Application Priority Data

Jul. 31, 1998 [JP] Japan ................... 10-218031

[51] Int. Cl.$^7$ ................................ H01L 21/339
[52] U.S. Cl. .............................. 438/79; 438/144
[58] Field of Search ................. 438/60, 75, 76, 438/78, 79, 144, 145

[56] References Cited

U.S. PATENT DOCUMENTS

| | | | |
|---|---|---|---|
| 4,900,688 | 2/1990 | Halvis ................... | 438/144 |
| 5,118,631 | 6/1992 | Dyck et al. ............ | 438/79 |
| 5,516,714 | 5/1996 | Kim ....................... | 438/76 |
| 5,877,520 | 3/1999 | Hynecek ................ | 438/79 |

FOREIGN PATENT DOCUMENTS 4-24872 4/1992 Japan .

*Primary Examiner*—Chandra Chaudhari
*Attorney, Agent, or Firm*—McGinn & Gibb, P.C.

[57] ABSTRACT

A method for driving a solid-state imaging device such as a CCD (Charge Coupled Device) which facilitates control of a blooming suppressing voltage and can reduce a voltage required for shuttering. The solid-state imaging device to be driven typically comprises a first one-conductive type region, a second one-conductive type region having a one-conductive type impurity concentration lower than that of the first one-conductive type region and provided on the first one-conductive type region in contact with the first one-conductive type region, an opposite-conductive type region in contact with the second one-conductive type region, and a one-conductive type layer forming a p-n junction together with the opposite-conductive type region and constituting a photodiode portion together with the opposite-conductive type region. When the solid-state imaging device is driven, a blooming suppressing voltage of a reverse bias is applied between the opposite-conductive type region and the first one-conductive type region so as to form a depletion layer edge within the second one-conductive type region.

10 Claims, 7 Drawing Sheets

METHOD FOR DRIVING SOLID-STATE IMAGING DEVICE

BACKGROUND OF THE INVENTION

1. Field of the Invention

The present invention relates to a method for driving a solid-state imaging device using a CCD (Charge Coupled Device) or the like.

2. Description of the Prior Art

Solid-state imaging devices using CCDs are widely used for an apparatus such as a video camera and digital still camera.

One problem to be solved in solid-state imaging devices using, for example, CCDs is a blooming phenomenon. The blooming phenomenon is a phenomenon that when more light than the saturation light amount of a photodiode (PD) portion of in a solid-state imaging device is incident thereon, signal charge overflows the photodiode portion to cause surplus charge to flow into surrounding pixels, with a result that a bright region exposed to light extends even to a portion not exposed to light in a taken image. The blooming phenomenon may occur at any position even other than a region for receiving light, for example in a vertical transfer unit, as long as it is provided with a p-n junction and may serve as a photodiode.

To suppress the blooming phenomenon, an overflow drain has been conventionally formed in CCDs to draw out surplus charge to a substrate side, for example. Specifically, an n-type substrate is provided on its surface with a p well region which is provided on its surface with an n$^+$ region such that the p well region and the n$^+$ region constitute a photodiode. A reverse bias voltage is applied between the p well region and the n substrate to completely deplete the p well region. When intense light is incident on a photodiode portion in the vertical overflow drain structure, a potential at the photodiode is reduced to cause a reduction in a potential at an n$^+$-p junction, thereby discarding surplus charge to the n-type substrate side.

When the vertical overflow drain structure is employed, the blooming phenomenon can be suppressed. Simultaneously, the application of a sweep pulse to the photodiode portion can draw out accumulated signal charge in the substrate direction to enable electronic shuttering to be performed. For electronic shuttering, a low operating voltage is desirable for sweeping away charge to the substrate side.

However, in the aforementioned vertical overflow drain structure, since variations in an impurity concentration in the n-type substrate cause variations in the saturation capacity or a read-out potential among respective photodiodes, fixed pattern noise referred to as swirl may occur on a taken image.

To suppress the generation of the swirl as well as the blooming phenomenon, Japanese Patent Publication No. 4-24872 (JP, 04024872, B2) discloses a solid-state imaging device in which, in a pixel region including a photodiode of a CCD, an n-type substrate is provided thereon with an n$^+$-type epitaxial layer having an n-type impurity diffused therein at a relatively high concentration and an n-type epitaxial layer having an n-type impurity diffused therein at a relatively low concentration in this order, and the n-type epitaxial layer is provided therein with a p region (so-called p well region) which is provided on its surface with an n-type layer such that the p region and the n-type layer constitute a photodiode. The solid-state imaging device makes it possible to locate a depletion layer edge in the n$^+$-type epitaxial layer whenever a reverse bias voltage is applied between the n-type substrate and the p region with settings of layer thicknesses and impurity concentrations. In order to locate the depletion layer edge in the n$^+$-type epitaxial layer whenever a reverse bias voltage is applied between the n-type substrate and the p region, it is required to determine the thickness and impurity concentration of the n-type layer such that the depletion layer edge is located within the n-type layer in a state where a reverse bias voltage is at 0 V. According to a technology disclosed in JP, 04024872, B2, it is possible to reduce a reverse bias voltage to be applied to the solid-state imaging device and to prevent the generation of swirl by locating the depletion layer edge in the n$^+$-type epitaxial layer having a uniform distribution of the impurity concentration.

FIG. 1 is a schematic sectional view showing a configuration of a pixel portion of the solid-state imaging device disclosed in JP, 04024872, B2. FIG. 2 is a diagram showing potential distribution in a depth direction in a photodiode portion of the solid-state imaging device shown in FIG. 1.

On an n-type substrate 11 made of silicon, an n$^+$-type epitaxial layer 12 is formed as a first epitaxial layer with a thickness of 15 μm and an n-type impurity concentration of $1 \times 10^{15}$ cm$^{-3}$ on which an n-type epitaxial layer 13 is formed with a thickness of 2 μm and an n-type impurity concentration of $1 \times 10^{14}$ cm$^{-3}$. The n-type epitaxial layer 13 is provided on its surface with a p region 14 (so-called p well layer) having a p-type impurity diffused therein which is further provided on its surface with an n layer 17 having an n-type impurity diffused therein. The p region 14 and n layer 17 form a p-n junction which serves as a photodiode portion. In the photodiode portion, the p region 14 has a thickness of 1.2 μm and a p-type impurity concentration of $5 \times 10^{15}$ cm$^{-3}$, while the n layer 17 has a thickness of 0.8 μm and an n-type impurity concentration of $5 \times 10^{16}$ cm$^{-3}$. A p-n junction between the n-type epitaxial layer 13 and the p region 14 is an abrupt junction in which a width of a depletion layer extending from the junction interface to the n-type epitaxial layer 13 side can be simply calculated based on respective impurity concentrations of the n-type epitaxial layer 13 and p region 14. When a calculation is made using the example herein shown, it can be seen that a depletion layer edge is located within the n$^+$-type epitaxial layer 12 beyond the n-type epitaxial layer 13 even on condition that a reverse bias voltage is at 0 V since the n-type epitaxial layer 13 has a low impurity concentration and a thin film thickness.

Additionally, a transfer gate comprising an p layer 15 extending more deeply than the p-n junction of the photodiode, an n layer 16 formed on a surface of the p layer 15, and a transfer electrode 19 acting as a gate electrode for the p layer 15 is provided for transferring accumulated charge in the photodiode portion generated with incident light to a charge transfer unit (not shown) of the CCD. In the example herein shown, the charge accumulated in the photodiode portion is transferred to the right in FIG. 1, and a p$^+$ layer 18 is provided for preventing the charge from being transferred to the left in FIG. 1. The n-type epitaxial layer 13, p region 14, p layer 15, n layers 16, 17 and p$^+$ layer 18 are formed in an n-type epitaxial region serving as a second epitaxial layer, and the second epitaxial layer is formed on the n$^+$-type epitaxial layer which serves as the first epitaxial layer. Additionally, light shield film 20 is formed such that light is incident only on the photodiode portion.

In the conventional solid-state imaging device shown in FIG. 1, a reverse bias voltage (blooming suppressing voltage) is applied between the p region (p well region) 14 and the n-type substrate 11 such that the depletion layer edge is located within the n+-type epitaxial layer 12. FIG. 2 conceptually shows potential distribution in the photodiode portion in a depth direction when the blooming suppressing voltage is applied in the aforementioned manner. A hatched portion in FIG. 2 represents a region which is not depleted. When light is incident on the photodiode portion, negative charge is accumulated corresponding to the peak portion of the potential above the point at which "barrier" is written on the potential curve in FIG. 2. However, when intense light is incident, the p-n junction of the photodiode portion becomes shallow to cause surplus charge to be drawn out to the substrate side beyond the barrier.

FIG. 3 is a graph conceptually showing a relationship between a substrate potential relative to the p region 14 and saturation charge amount $Q_{max}$ of the photodiode portion when the depletion layer edge is located within the n+-type epitaxial layer 12 whenever a reverse bias voltage is applied between the n-type substrate 11 and the p region 14. It can seen that when a blooming suppressing voltage is applied to increase saturation charge amount $Q_{max}$, the saturation charge amount greatly varies with a slight change in the substrate potential to make it difficult to control the blooming suppressing voltage. If a certain variation is expected in the saturation charge amount of the photodiode portion, it is required to set imaging conditions or the like of the solid-state imaging device based on a smaller one of expected saturation charge amounts, thus causing a reduced dynamic range, a deteriorated signal to noise ratio, or the like.

SUMMARY OF THE INVENTION

It is an object of the present invention to provide a method for driving a solid-state imaging device which facilitates control of a blooming suppressing voltage and can reduce a voltage required for shuttering.

The object of the present invention is achieved by a method for driving a solid-state imaging device, comprising the steps of providing a solid-state imaging device having a first one-conductive type region, a second one-conductive type region having a one-conductive type impurity concentration lower than that of the first one-conductive type region and provided on the first one-conductive type region in contact with the first one-conductive type region, an opposite-conductive type region in contact with the second one-conductive type region, and a one-conductive type layer forming a p-n junction together with the opposite-conductive type region and constituting a photodiode portion together with the opposite-conductive type region, and applying a blooming suppressing voltage of a reverse bias between the opposite-conductive type region and the first one-conductive type region so as to form a depletion layer edge within the second one-conductive type region.

According to the present invention, it becomes possible to facilitate control of the blooming suppressing voltage and to suppress variations in the saturation charge amount in the photodiode portion, thereby improving a dynamic range and a signal to noise ratio of a solid-state imaging device.

In the method for driving according to the present invention, when all of charge accumulated in the photodiode portion is removed for shuttering, a reverse bias voltage may be applied in pulse form between the opposite-conductive type region and the first one-conductive type region so as to form a depletion layer edge within the first one-conductive type region. Such application of a reverse bias voltage in pulse form enables a reduction in a voltage required for shuttering.

In the present invention, when a concentration of the one-conductive type impurity is represented with the number of atoms per unit volume, the first one-conductive type region preferably includes the one-conductive type impurity at a concentration five or more times higher than that of the second one-conductive type region, and more preferably at a concentration ten or more times higher than that of the second one-conductive type region.

The above and other objects, features, and advantages of the present invention will become apparent from the following description referring to the accompanying drawings which illustrate an example of a preferred embodiment of the present invention.

DESCRIPTION OF THE PREFERRED EMBODIMENTS

Next, preferred embodiments of the present invention will be described with reference to the drawings. It should be noted that the following description takes as an example a case in which one-conductive type in the appended claims is an n-type and an opposite-conductive type is a p-type. In this case, electrons are accumulated as electric charge in a photodiode portion. Of course, even if the n-type and the p-type in the following description are reversed, that is, if the one-conductive type in the appended claims is the p-type and the opposite-conductive type is the n-type, the only difference is that holes are accumulated as electric charge in the photodiode portion and essential effects of the present invention are not changed. The present invention equally encompasses both a case where the one-conductive type in the appended claims is the n-type and the opposite-conductive type is the p-type and a case where the one-conductive type is the p-type and the opposite-conductive type is the n-type.

Figure 1:
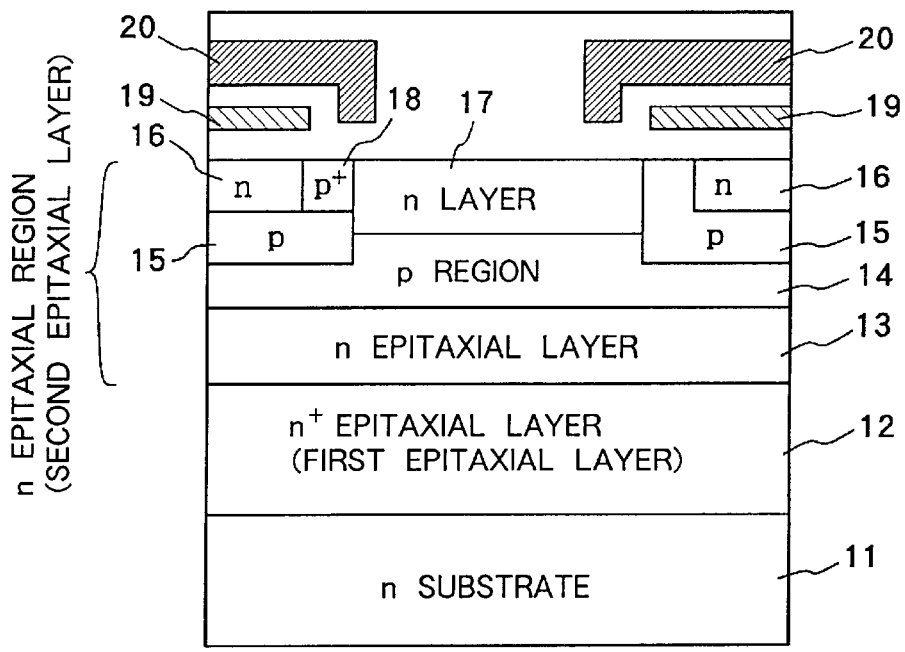
FIG. 1 is a schematic sectional view showing a configuration of a pixel portion of a conventional solid-state imaging device.
Figure 2:
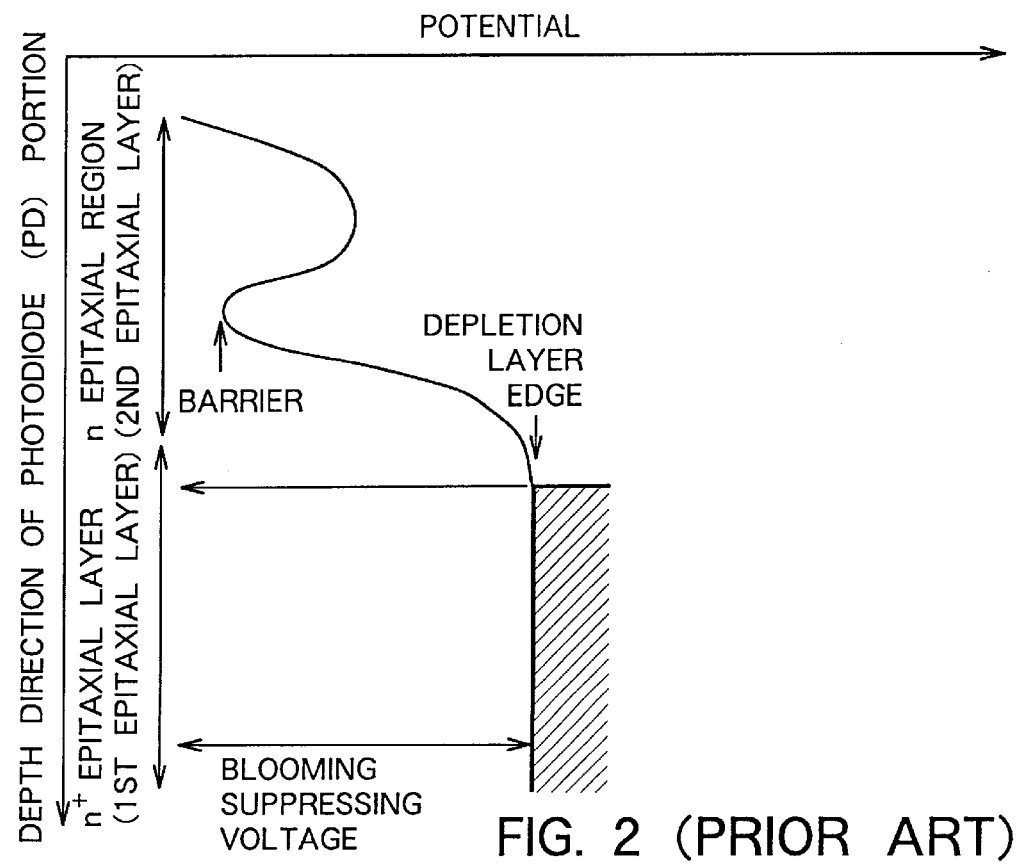
FIG. 2 is a diagram showing potential distribution in the photodiode portion in a depth direction in the solid-state imaging device shown in FIG. 1.
Figure 4:
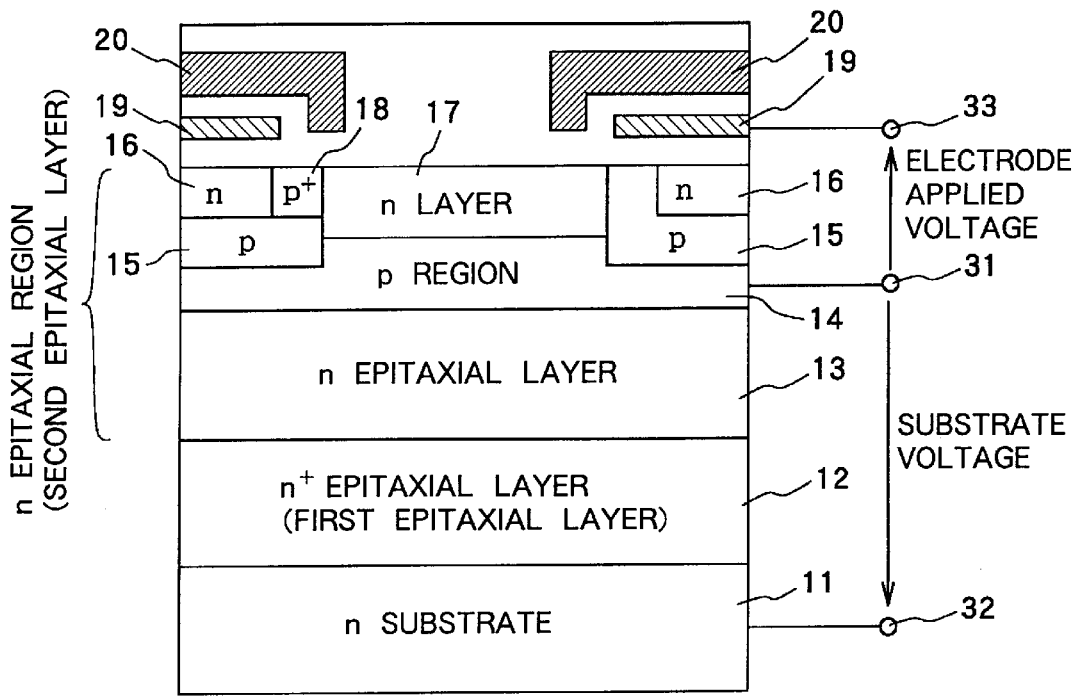
FIG. 4 is a schematic sectional view showing a configuration of a pixel portion of a solid-state imaging device to which a driving method of a preferred embodiment of the present invention is applied.

A solid-state imaging device shown in FIG. 4, to which a driving method of a preferred embodiment according to the present invention is applied, has a similar configuration to that of the solid-state imaging device shown in FIG. 1. In FIG. 4, reference numerals identical to those in FIG. 1 represent the same components as those in FIG. 1. In the solid-state imaging device shown in FIG. 4, the p region 14 is connected to an electrode 31, the n-type substrate 11 to an electrode 32, and the transfer electrode 19 to an electrode 33, respectively, for explicitly showing that a voltage (substrate voltage) is applied between the p region 14 and the n-type substrate 11 and another voltage (electrode applied voltage) is applied between the p region 14 and the transfer electrode 19.

The solid-state imaging device shown in FIG. 4 suppresses blooming with a vertical overflow drain structure and is driven such that a depletion layer edge is located within the n-type epitaxial layer 13 serving as the second epitaxial layer at the application of a blooming suppressing voltage, while the depletion layer edge is located within the n+-type epitaxial layer 12 serving as the first epitaxial layer at the application of a voltage for drawing out all of charge accumulated in the photodiode portion to the substrate side for electronic shuttering. In order to ensure such positions of the depletion layer edge, for example, a silicon substrate with an impurity concentration of approximately $1 \times 10^{14}$ $cm^{-3}$ is used for the n-type substrate 11, the thickness and the n-type impurity concentration of the n+-type epitaxial layer 12 are set to be 15 $\mu$m and $1 \times 10^{15}$ $cm^{-3}$, respectively, the thickness and the n-type impurity concentration of the n-type epitaxial layer 13 are set to be 13 $\mu$m and $1 \times 10^{14}$ $cm^{-3}$, respectively, the thickness and the impurity concentration of the p region 14 are set to be 1.2 $\mu$m and $5 \times 10^{15}$ $cm^{-3}$, respectively, and the thickness, and the impurity concentration of the n layer 17 are set to be 0.8 $\mu$m and $5 \times 10^{16}$ $cm^{-3}$, respectively.

Since a p-n junction between the n-type epitaxial layer 13 and the p region 14 is an abrupt junction, the position of the edge of the depletion layer extending from the junction interface toward the n-type substrate 11 can be easily calculated. With the above-specified thicknesses and the impurity concentrations employed, the solid-state imaging device shown in FIG. 4 has the depletion layer edge located within the n-type epitaxial layer 13 and at a position near the p-n junction when a reverse bias voltage is at 0 V since the n-type epitaxial layer 13 is thicker than that in the conventional solid-state imaging device shown in FIG. 1. The thickness of the n-type epitaxial layer 13 shown in FIG. 4 is 13 $\mu$m as compared with 2 $\mu$m of that shown in FIG. 1. Therefore, even when a blooming suppressing voltage of a certain magnitude is applied as a reverse bias, the depletion layer edge is still located within the n-type epitaxial layer 13. Of course, the application of a reverse bias voltage higher than such a blooming suppressing voltage causes the position of the depletion layer edge to move into the n+-type epitaxial layer 12, thereby making it possible to perform shuttering.

In the solid-state imaging device herein described, the n+-type epitaxial layer 12 corresponds to a first one-conductive type region, the n-type epitaxial layer 13 to a second one-conductive type region, the p region 14 to an opposite-conductive type region, and the n-layer 17 to a one-conductive type layer.

Figure 5:
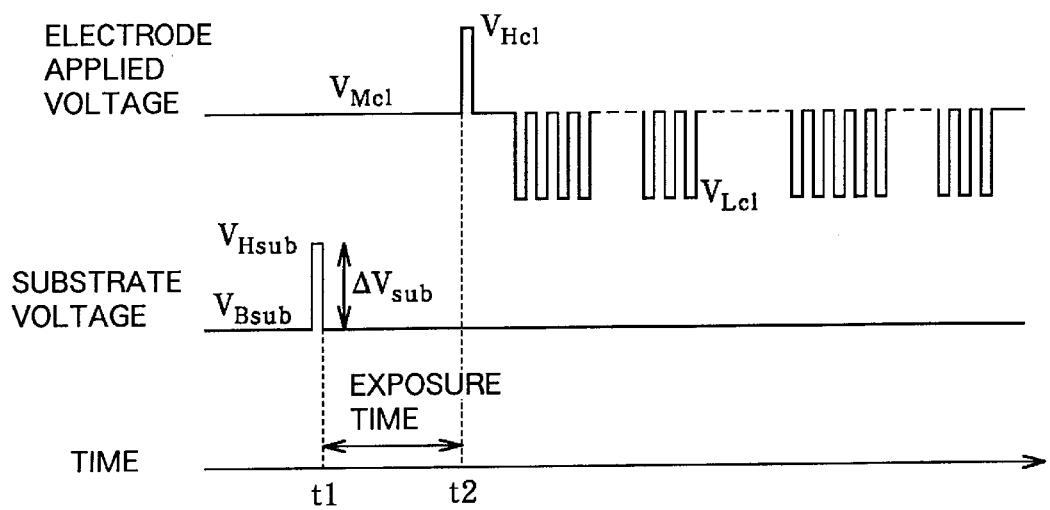
FIG. 5 is a timing chart showing an example of driving waveforms for the solid-state imaging device shown in FIG. 4.

FIG. 5 is a timing chart showing an example of driving waveforms for the solid-state imaging device shown in FIG. 4. Blooming suppressing voltage $V_{Bsub}$ is constantly applied as a substrate voltage of a reverse bias between the p region 14 and the n-type substrate 11 during a normal operation, at least during an exposure time. Additionally, voltage $V_{Mc1}$ is applied between the p region 14 and the transfer electrode 19. In order to perform imaging in a predetermined exposure time, voltage $V_{Hsub}$ is applied as a substrate voltage in pulse form for drawing out all of charge accumulated in the photodiode portion to the substrate side at time t1 corresponding to a starting time of the exposure time. The difference between voltage $V_{Hsub}$ and blooming suppressing voltage $V_{Bsub}$ is represented by $\Delta V_{sub}$. At time t2 corresponding to an end time of the exposure time, voltage $V_{Hc1}$ is applied to the transfer electrode 19 as an electrode applied voltage in pulse form to cause charge accumulated in the photodiode portion to be transferred to a charge transfer unit through a transfer gate. Thereafter, a comb-shaped voltage in pulse form oscillating between voltage $V_{Lc1}$ ($V_{Mc1} > V_{Lc1}$) and voltage $V_{Mc1}$ is applied to transfer electrode 19 for subsequently transferring the charge in the charge transfer unit.

Figure 6:
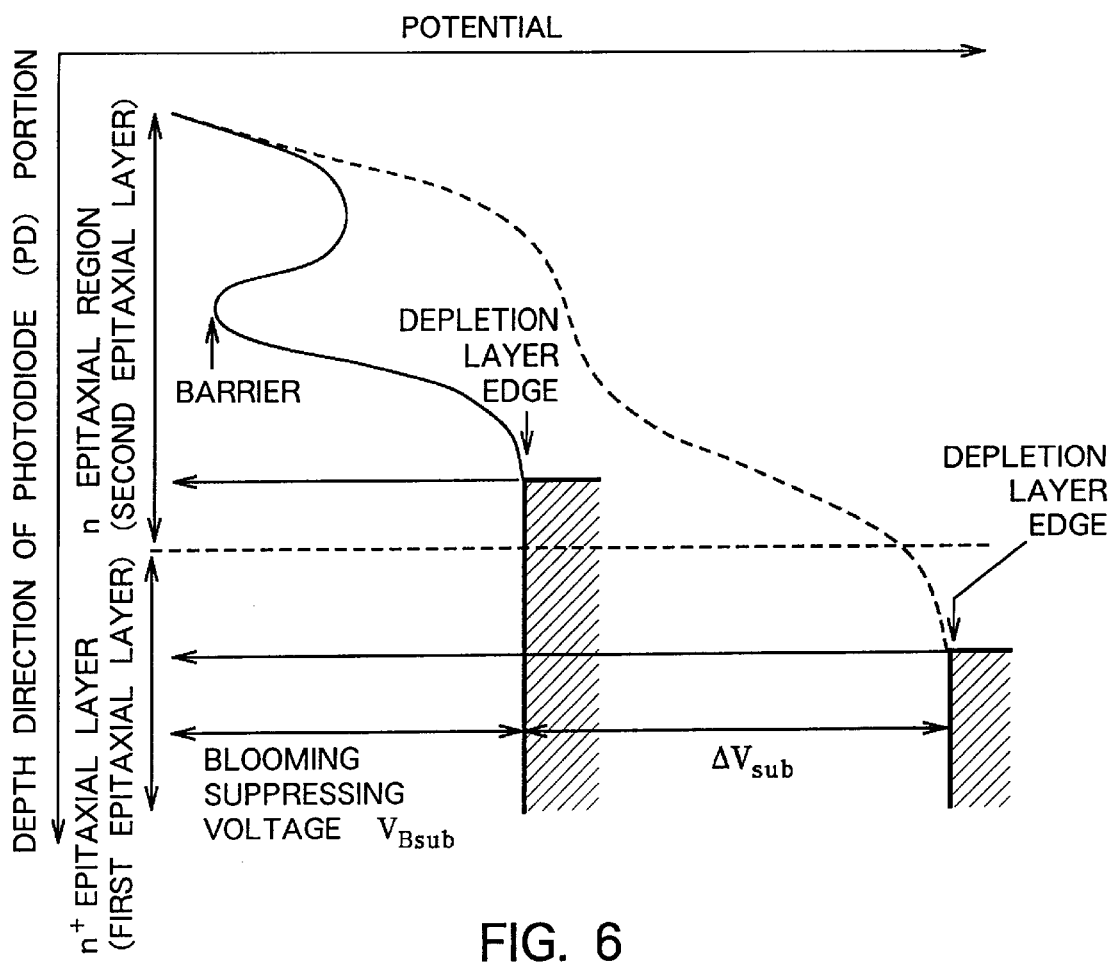
FIG. 6 is a diagram showing potential distribution in the photodiode portion in a depth direction in the solid-state imaging device shown in FIG. 4.

FIG. 6 shows potential distribution in a depth direction in the photodiode portion of the solid-state imaging device shown in FIG. 4. A solid line curve in FIG. 6 represents a potential curve when blooming suppressing voltage $V_{Bsub}$ is applied between the p region 14 and the n-type substrate 11, a broken line curve represents a potential curve when voltage $V_{Hsub}$ for drawing out all charge to the substrate side is applied between the p region 14 and the n-type substrate 11, and a hatched region represents a region which is not depleted. It can be seen that the depletion layer edge is located within the n-type epitaxial layer 13 and a barrier is formed for suppressing blooming during the application of blooming suppressing voltage $V_{Bsub}$, and the depletion layer edge is located within the n+-type epitaxial layer 12 and the barrier disappears during the application of $V_{Hsub}$.

Figure 3:
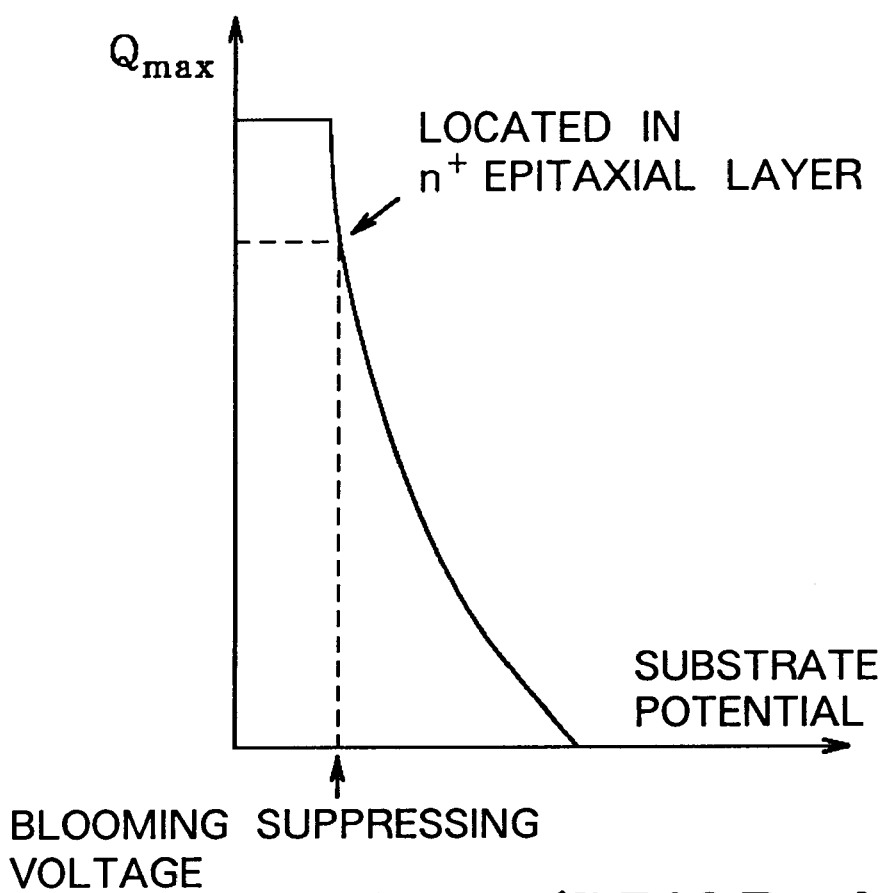
FIG. 3 is a graph conceptually showing dependence of saturation charge amount $Q_{max}$ of the photodiode portion upon a substrate potential in the solid-state imaging device shown in FIG. 1.
Figure 7:
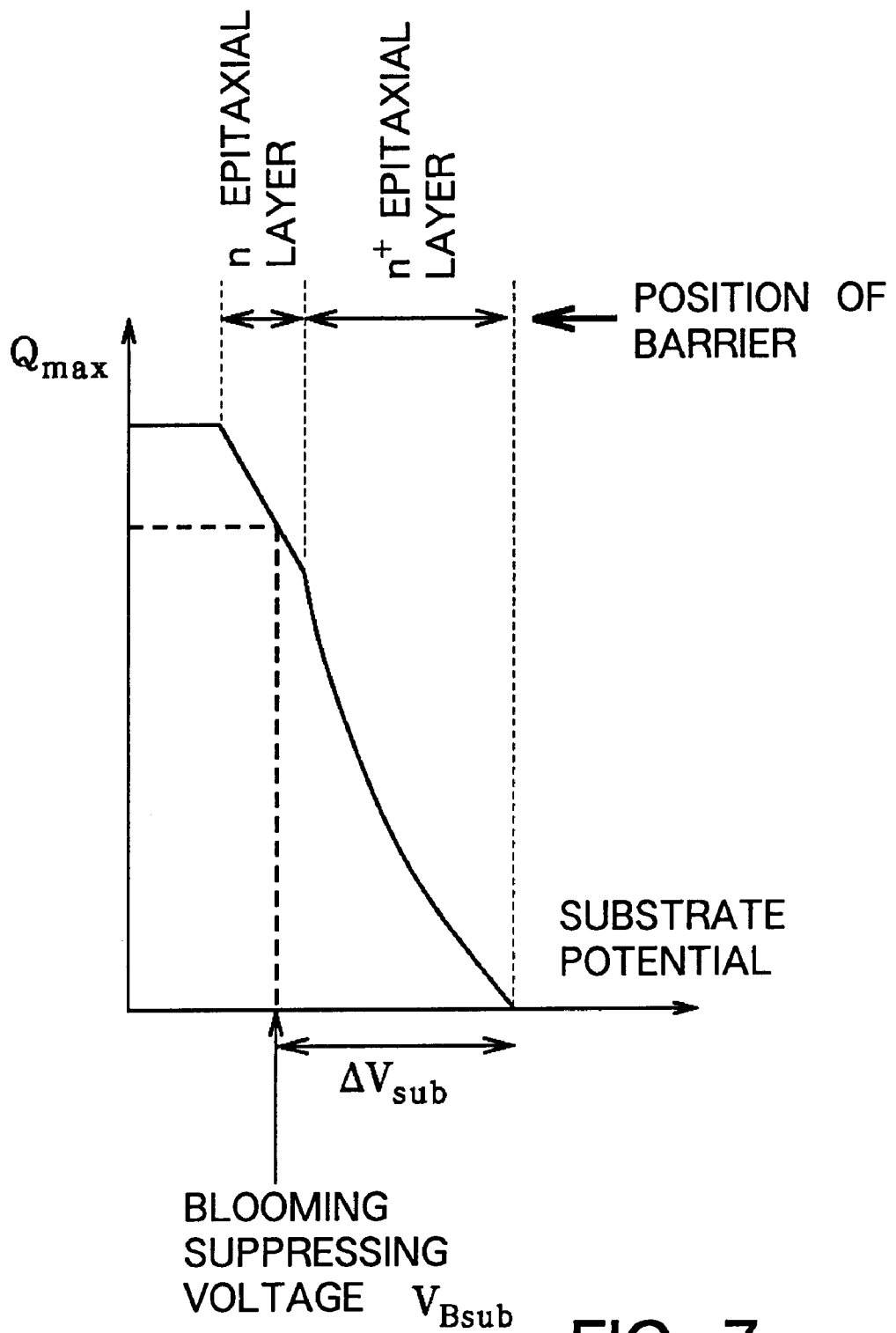
FIG. 7 is a graph conceptually showing dependence of saturation charge amount $Q_{max}$ of the photodiode portion upon a substrate potential in the solid-state imaging device shown in FIG. 4.

FIG. 7 is a graph conceptually showing a relationship between a substrate potential relative to the p region 14 and saturation charge amount $Q_{max}$ in the photodiode portion when the solid-state imaging device shown in FIG. 4 is driven as described above. In this embodiment, as apparent from a comparison with FIG. 3 showing the conventional driving method, blooming suppressing voltage $V_{Bsub}$ is applied such that the depletion layer edge is located within the n-type epitaxial layer 13 having a relatively low impurity concentration, thereby reducing a change in saturation capacity value $Q_{max}$ associated with a change in the substrate potential. Therefore, according to the present invention, control of the blooming suppressing voltage is facilitated. As a result, it is possible to suppress a variation in the saturation charge amount in the photodiode portion, increasing a dynamic range and improving a signal to noise ratio. It is presumed that the control of the blooming suppressing voltage is thus facilitated because the depletion layer edge is located within the n-type epitaxial layer 13 and extends to the substrate side at a lower impurity concentration in response to the substrate voltage to reduce a variation in the barrier potential with respect to a variation in the substrate potential.

Additionally, according to the method for driving a solid-state imaging device, it is possible to reduce voltage $V_{Hsub}$ (which is equal to blooming suppressing voltage $V_{Bsub}$ plus $\Delta V_{sub}$) for drawing out all of charge to the substrate side for shuttering. Specifically, when voltage $V_{Hsub}$ is applied to completely deplete the photodiode portion, the depletion layer edge is located within the n⁺ type epitaxial layer and does not extend to the substrate side at a higher impurity concentration to result in an increased variation in the barrier potential with respect to a variation in the substrate potential. For this reason, it is possible to reduce voltage $V_{Hsub}$ (or $\Delta V_{sub}$).

Although an embodiment of the present invention has been described, a solid-state imaging device to which the present invention is applied is not limited to the aforementioned one.

Figure 8:
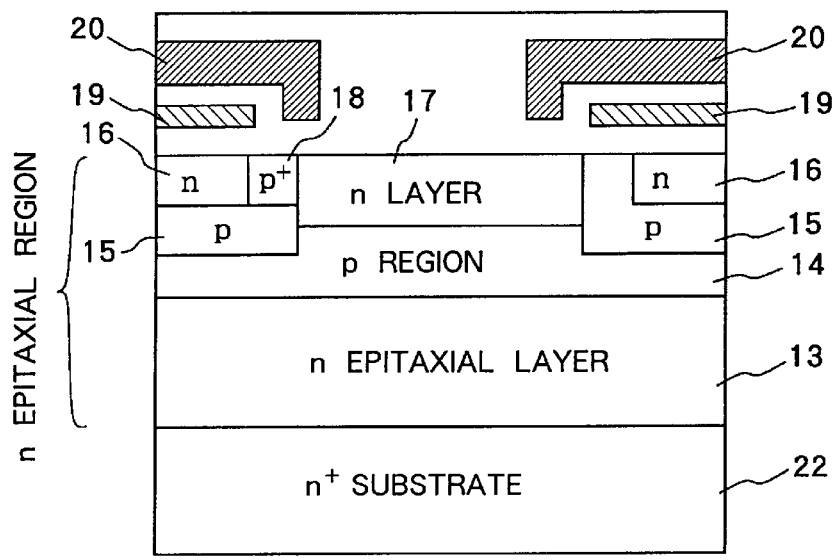
FIG. 8 is a schematic sectional view showing a configuration of a pixel portion of another solid-state imaging device to which the driving method of the present invention is applied.

FIG. 8 is a schematic sectional view showing a configuration of a photodiode portion of another solid-state imaging device to which the driving method of the present invention is applied. The solid-state imaging device shown in FIG. 8 is provided with an n⁺-type substrate 22 having a high n-type impurity concentration therein instead of the n-type substrate and the n⁺-type epitaxial layer in the solid-state imaging device shown in FIG. 4. Therefore, the n-type epitaxial layer 13 is directly provided on the n⁺-type substrate 22 and the n⁺-type substrate 22 corresponds to the first one-conductive type region. When the solid-state imaging device shown in FIG. 8 is used, it is designed such that an edge of a depletion layer is located within the n-type epitaxial layer 13 at the application of blooming suppressing voltage $V_{Bsub}$, while the depletion layer edge is located within the n⁺-type substrate 22 at the application of voltage $V_{Hsub}$ for drawing out all of charge to the substrate side. Such driving enables facilitated control of blooming suppressing voltage $V_{Bsub}$ and a reduction in voltage $V_{Hsub}$ (or $\Delta V_{sub}$) for drawing out all of charge to the substrate side for shuttering, similarly to the aforementioned case.

Figure 9:
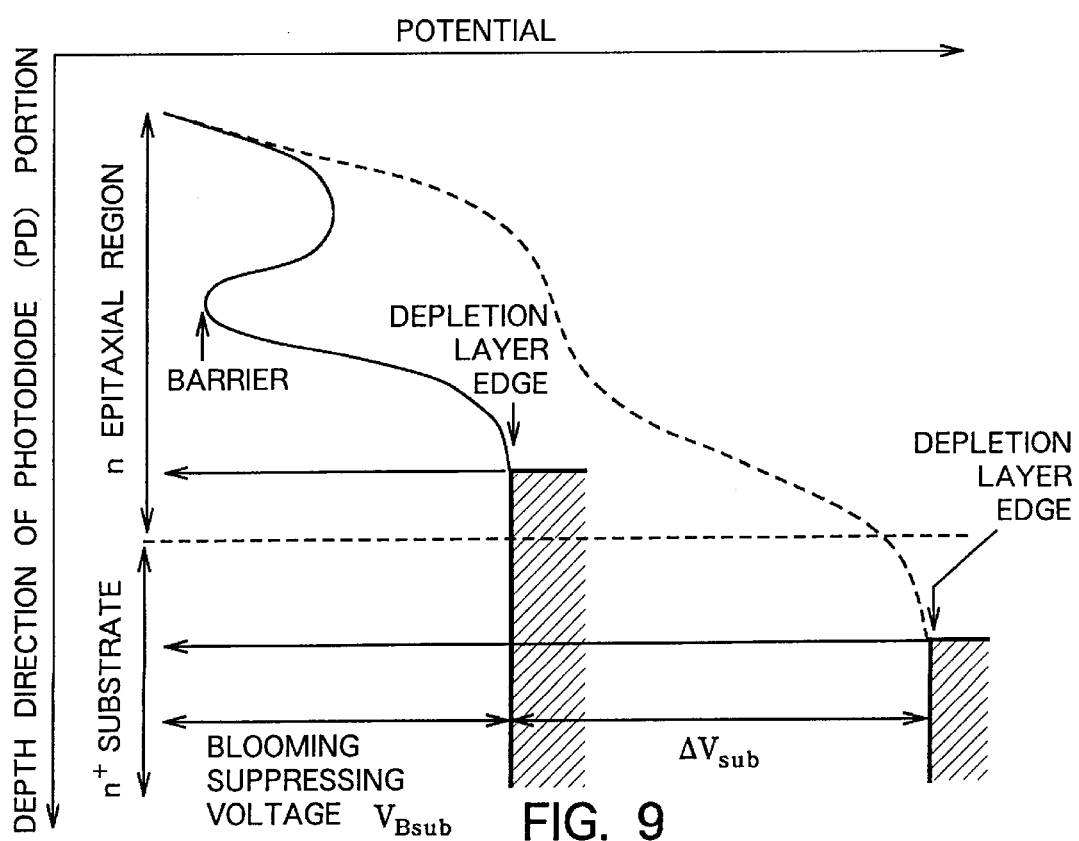
FIG. 9 is a diagram showing potential distribution in the photodiode portion in a depth direction in the solid-state imaging device shown in FIG. 8.

FIG. 9 is a diagram showing potential distribution in the photodiode portion in a depth direction in the solid-state imaging device shown in FIG. 8. A solid line curve in FIG. 9 represents a potential curve when blooming suppressing voltage $V_{Bsub}$ is applied between the p region 14 and the n⁺-type substrate 22, a broken line curve represents a potential curve when voltage $V_{Hsub}$ for drawing out all of charge to the substrate is applied between the p region 14 and the n⁺-type substrate 22, and a hatched region represents a region which is not depleted. It can be seen that the depletion layer edge is located within the n-type epitaxial layer 13 and a barrier is formed for suppressing blooming at the application of blooming suppressing voltage $V_{Bsub}$, while the depletion layer edge is located within the n⁺-type substrate 22 and the barrier disappears at the application of voltage $V_{Hsub}$.

Figure 10:
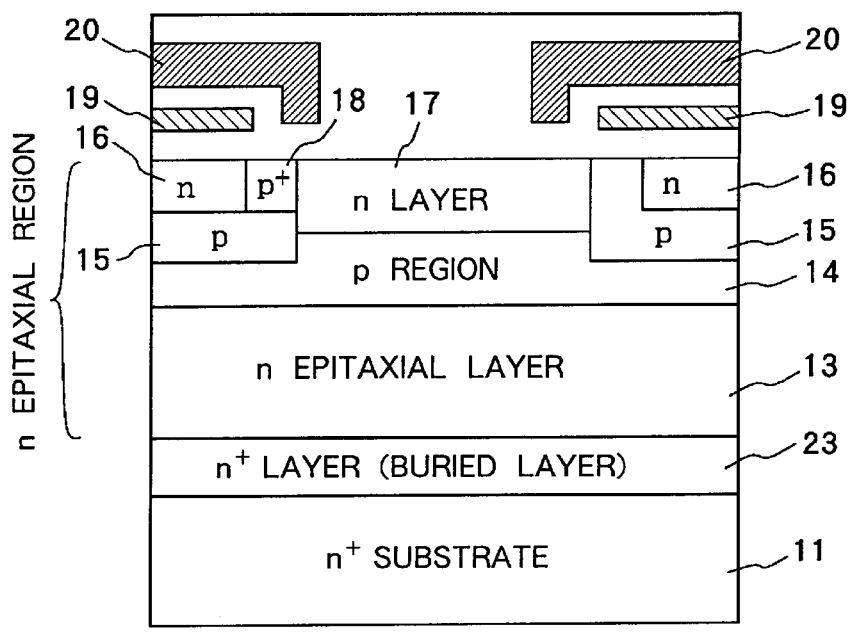
FIG. 10 is a schematic sectional view showing a configuration of a pixel portion of yet another solid-state imaging device to which the driving method of the present invention is applied.

FIG. 10 is a schematic sectional view showing a configuration of a photodiode portion of yet another solid-state imaging device to which the present invention is applied. The solid-state imaging device shown in FIG. 10 is provided with the n⁺-type layer 23 as a buried diffusion layer instead of the n⁺-type epitaxial layer in the solid-state imaging device shown in FIG. 4. Therefore, the n-type substrate 11, n⁺-type layer 23, and n-type epitaxial layer 13 are stacked in this order. The n⁺-type layer 23, which is the buried diffusion layer, is thinner than the n⁺-type epitaxial layer 12 in the solid-state imaging device shown in FIG. 4. The n⁺-type layer 23 corresponds to the first one-conductive type region. When the solid-state imaging device shown in FIG. 10 is used, it is designed such that an edge of a depletion layer is located within the n-type epitaxial layer 13 at the application of blooming suppressing voltage $V_{Bsub}$, while the depletion layer edge is located within the n⁺-type substrate 23 at the application of voltage $V_{Hsub}$ for drawing out all of charge to the substrate side. Such driving enables facilitated control of blooming suppressing voltage $V_{Bsub}$ and a reduction in voltage $V_{Hsub}$ (or $\Delta V_{sub}$) for drawing out all of charge to the substrate side for shuttering, similarly to the aforementioned embodiments.

Figure 11:
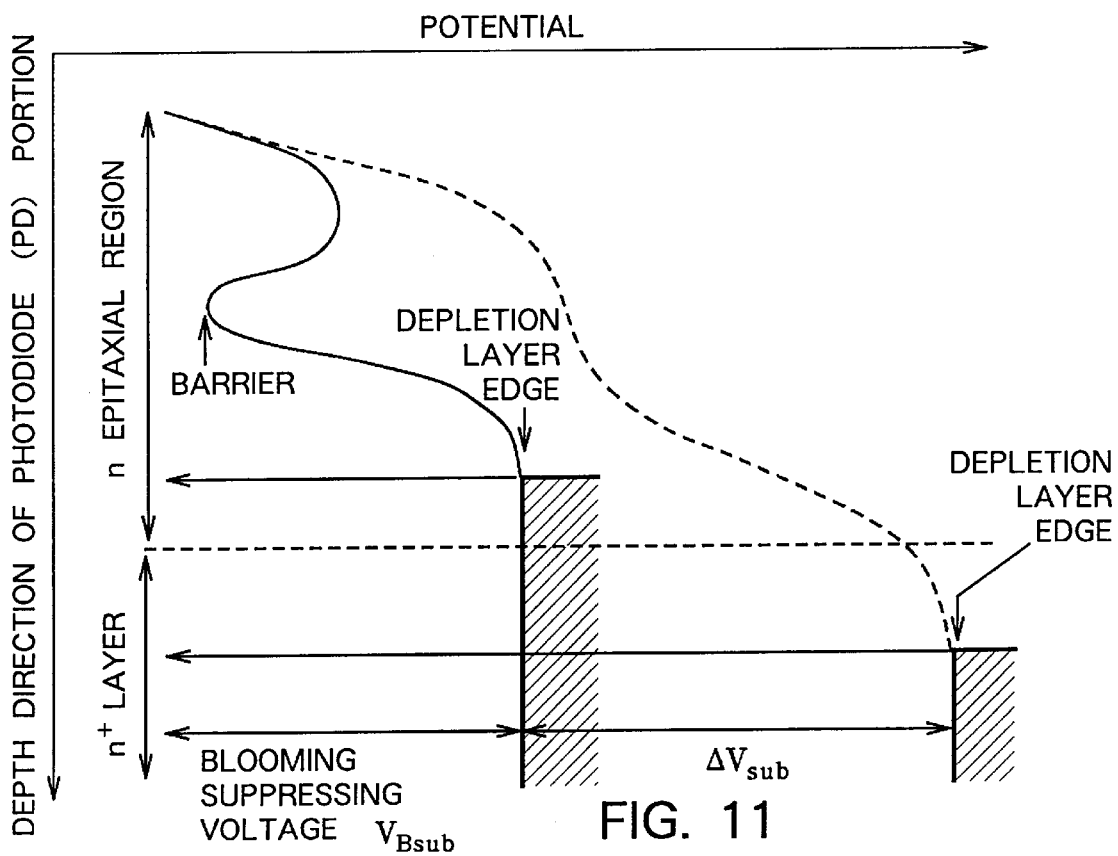
FIG. 11 is a diagram showing potential distribution in the photodiode potion in a depth direction in the solid-state imaging device shown in FIG. 10.

FIG. 11 is a diagram showing potential distribution in the photodiode portion in a depth direction in the solid-state imaging device shown in FIG. 10. A solid line curve in FIG. 11 represents a potential curve when blooming suppressing voltage $V_{Bsub}$ is applied between the p region 14 and the n-type substrate 11, a broken line curve represents a potential curve when voltage $V_{Hsub}$ for drawing out all of charge to the substrate is applied between the p region 14 and the n-type substrate 11, and a hatched region represents a region which is not depleted. It can be seen that the depletion layer edge is located within the n-type epitaxial layer 13 and a barrier is formed for suppressing blooming at the application of blooming suppressing voltage $V_{Bsub}$, while the depletion layer edge is located within the n⁺-type substrate 23 and the barrier disappears at the application of voltage $V_{Hsub}$.

It is to be understood that variations and modifications of the driving method for solid-state imaging devices disclosed herein will be evident to those skilled in the art. It is intended that all such modifications and variations be included within the scope of the appended claims.

What is claimed is:

1. A method for driving a solid-state imaging device, comprising the steps of:

providing a solid-state imaging device having a first one-conductive type region, a second one-conductive type region having a one-conductive type impurity concentration lower than that of said first one-conductive type region and provided on said first one-conductive type region in contact with said first one-conductive type region, an opposite-conductive type region in contact with said second one-conductive type region, and a one-conductive type layer forming a p-n junction together with said opposite-conductive type region and constituting a photodiode portion together with said opposite-conductive type region; and applying a blooming suppressing voltage of a reverse bias between said opposite-conductive type region and said first one-conductive type region so as to form a depletion layer edge within said second one-conductive type region.

2. A method according to claim 1, wherein a reverse bias voltage is applied in pulse form between said opposite-conductive type region and said first one-conductive type region so as to form a depletion layer edge within said first one-conductive type region to remove charge accumulated in the photodiode portion.

3. A method according to claim 1, wherein said first one-conductive type region and said second one-conductive type region are regions formed with epitaxial growth.

4. A method for driving a solid-state imaging device having a first one-conductive type region, a second one-conductive type region having a one-conductive type impurity concentration lower than that of said first one-conductive type region and provided on said first one-conductive type region in contact with said first one-conductive type region, an opposite-conductive type region in contact with said second one-conductive type region, and a one-conductive type layer forming a p-n junction together with said opposite-conductive type region and constituting a photodiode portion together with said opposite-conductive type region, a charge transfer unit, and a transfer gate having a transfer electrode for transferring charge accumulated in the photodiode portion to the charge transfer unit, said method comprising the steps of:

constantly applying a blooming suppressing voltage of a reverse bias between said opposite-conductive type region and said first one-conductive type region at least during an exposure time so as to form a depletion layer edge within said second one-conductive type region;

applying a reverse bias voltage in pulse form between said opposite-conductive type region and said first one-conductive type region at a starting point of an exposure time so as to form a depletion layer edge within said first one-conductive type region to remove charge accumulated in the photodiode portion; and applying a voltage between said opposite-conductive type region and the transfer electrode at an end time of the exposure time to transfer charge accumulated in the photodiode portion during the exposure time to said charge transfer unit.

5. A method according to claim 4, wherein said first one-conductive type region and said second one-conductive type region are regions formed with epitaxial growth.

6. A method according to claim 5, wherein said first one-conductive type region is formed on a one-conductive type substrate made of silicon.

7. A method according to claim 1, wherein said first one-conductive type region is a one-conductive type substrate made of silicon, and said second one-conductive type region is a region formed on the one-conductive type substrate with epitaxial growth.

8. A method according to claim 4, wherein said first one-conductive type region is a one-conductive type substrate made of silicon, and said second one-conductive type region is a region formed on the one-conductive type substrate with epitaxial growth.

9. A method according to claim 1, wherein said first one-conductive type region is a buried diffusion layer formed on a one-conductive type substrate made of silicon, said the second one-conductive type region is a region formed with epitaxial growth.

10. A method according to claim 4, wherein said first one-conductive type region is a buried diffusion layer formed on a one-conductive type substrate made of silicon, and said second one-conductive type region is a region formed with epitaxial growth.

* * * * *